(12) United States Patent
Tang et al.

(10) Patent No.: US 9,350,326 B2
(45) Date of Patent: May 24, 2016

(54) VOLTAGE SAMPLING SCHEME WITH DYNAMICALLY ADJUSTABLE SAMPLE RATES

(71) Applicant: Apple Inc., Cupertino, CA (US)

(72) Inventors: Bo Tang, Sunnyvale, CA (US); Ajay Kumar Bhatia, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/455,195

(22) Filed: Aug. 8, 2014

(65) Prior Publication Data

US 2016/0043705 A1    Feb. 11, 2016

(51) Int. Cl.
*H03K 3/012*    (2006.01)

(52) U.S. Cl.
CPC ....................................... *H03K 3/012* (2013.01)

(58) Field of Classification Search
CPC .... G01R 19/00; G01R 19/0038; H03K 3/012; H03K 5/00; H03K 5/24; H03K 5/2418; H03K 5/2481; H03K 5/249
USPC ........................................................... 327/63
See application file for complete search history.

(56) References Cited

U.S. PATENT DOCUMENTS

| | | | |
|---|---|---|---|
| 6,762,629 B2 * | 7/2004 | Tam .......................... | G06F 1/08 327/101 |
| 6,774,709 B2 | 8/2004 | Castaldo et al. | |
| 7,403,405 B2 * | 7/2008 | Conte ................... | H02M 3/073 363/59 |

* cited by examiner

*Primary Examiner* — John Poos
*Assistant Examiner* — David Mattison
(74) *Attorney, Agent, or Firm* — Meyertons, Hood, Kivlin, Kowert & Goetzel, P.C.

(57) ABSTRACT

A apparatus including a clock source and a comparison circuit is presented. The clock source may be configured to generate a clock signal. The comparison circuit may be configured select a first frequency of the clock signal and to receive a plurality of voltage signal inputs for comparison. The comparison circuit may be further configured to compare a voltage level of a first voltage signal input of the plurality of voltage signal inputs to a voltage level of a second voltage signal input of the plurality of voltage signal inputs responsive to an active edge of the clock signal. The comparison circuit may also be configured to determine a comparison value corresponding to the comparison of the voltage levels and to select a second frequency of the clock signal dependent upon the comparison value, in which the second frequency is different than the first frequency.

20 Claims, 6 Drawing Sheets

VOLTAGE SAMPLING SCHEME WITH DYNAMICALLY ADJUSTABLE SAMPLE RATES

BACKGROUND

1. Technical Field

Embodiments described herein are related to the field of integrated circuit implementation, and more particularly to the implementation of circuits for sampling signals.

2. Description of the Related Art

Computing systems may include one or more systems-on-a-chip (SoC), which may integrate a number of different functions, such as, graphics processing, onto a single integrated circuit. With numerous functions included in a single integrated circuit, chip count may be kept low in mobile computing systems, such as tablets, for example, which may result in reduced assembly costs, and a smaller form factor for such mobile computing systems.

Since many functional blocks, such as memories, timers, serial ports, phase-locked loops (PLLs), analog-to-digital converters (ADCs) and more, may be included in an SoC, the probability that a given functional block is not in use at a given time may be high. When a functional block is not in use, the SoC may turn the block off by disabling power to it, thereby conserving power, reducing the internal chip operating temperature, and the like. When the functional block is needed again, power must be turned back on and the block must be initialized. Any data or operational settings stored in the functional block are lost when power is disabled.

In some SoC designs, functional blocks that are not used all of the time may be placed into a retention mode. In a retention mode, clock signals to the functional block may be disabled and the power supply to the block may be reduced to a level that allows the block to retain some or all of the operational settings and/or data contained within the block. This may allow some power savings or temperature reduction without a functional block requiring re-initialization when it is needed again. In order to implement a retention mode, a power supply with a voltage level below the main system operating voltage may be required. In addition, it is desirable to implement this power supply with minimal impact to the total chip power consumption.

Power regulation circuits may be designed in accordance with various design styles including passive and active designs. The flexibility to control a voltage output may be provided by using active power regulating circuits. Active power regulating circuits may allow control over the voltage output by monitoring the output and comparing the output to one or more known voltage references. The output may be adjusted higher or lower based on this comparison.

The process of monitoring the output and comparing the output to a known voltage reference may consume power itself and may therefore negate some of the desired power savings and temperature reduction. The monitoring process may be continuous, using analog circuits, such as analog comparators, to compare the output to the voltage reference. This approach may consume power while the power regulating circuit is actively being monitored. Another approach may include using a clocked digital circuit to periodically sample and compare the output. This approach may reduce power consumption by limiting the time spent sampling and comparing the output, but may introduce another source of power consumption to provide a clock signal with a high enough frequency to effectively monitor the output.

SUMMARY OF THE EMBODIMENTS

Various embodiments of a power management apparatus are disclosed. Broadly speaking, an apparatus and a method are contemplated in which the apparatus includes a clock source and a comparison circuit. The clock source may be configured to generate a clock signal. The comparison circuit may be configured select a first frequency of the clock signal and to receive a plurality of voltage signal inputs for comparison. The comparison circuit may be further configured to compare a voltage level of a first voltage signal input of the plurality of voltage signal inputs to a voltage level of a second voltage signal input of the plurality of voltage signal inputs responsive to an active edge of the clock signal. The comparison circuit may also be configured to determine a comparison value corresponding to the comparison of the voltage levels and to select a second frequency of the clock signal dependent upon the comparison value, in which the second frequency is different than the first frequency.

In a further embodiment, the clock source may include a multiplex circuit, in which the clock signal corresponds to an output of the multiplex circuit. To select the second frequency, the comparison circuit may be configured to select a different input to the multiplex circuit as the clock signal.

In another embodiment, the plurality of voltage signal inputs may include a first reference voltage signal and an output signal of a voltage regulator. In a further embodiment, the plurality of voltage signal inputs may also include a second reference voltage signal, in which a voltage level of the second reference voltage signal is lower than a voltage level of the first reference voltage signal. In a still further embodiment, the comparison circuit may be configured to determine the comparison value depending upon a determination that a voltage level of the output signal of the voltage regulator is greater than or equal to the voltage level of the first reference voltage signal, is between the voltage level of the first reference voltage signal and the voltage level of the second reference voltage signal, or is less than or equal to the voltage level of the second reference voltage signal.

In one embodiment, the comparison circuit may be configured to store the comparison value, and to select the second frequency of the clock signal dependent upon a most recent comparison value and one or more previously stored comparison values. In another embodiment, the comparison circuit may be configured to enable the first reference voltage signal responsive to the active edge of the clock signal, and to compare the first reference voltage signal to the output signal of the voltage regulator responsive to a determination that a predetermined amount of time has elapsed since the first reference voltage signal was enabled.

BRIEF DESCRIPTION OF THE DRAWINGS

The following detailed description makes reference to the accompanying drawings, which are now briefly described.

Figure 1:
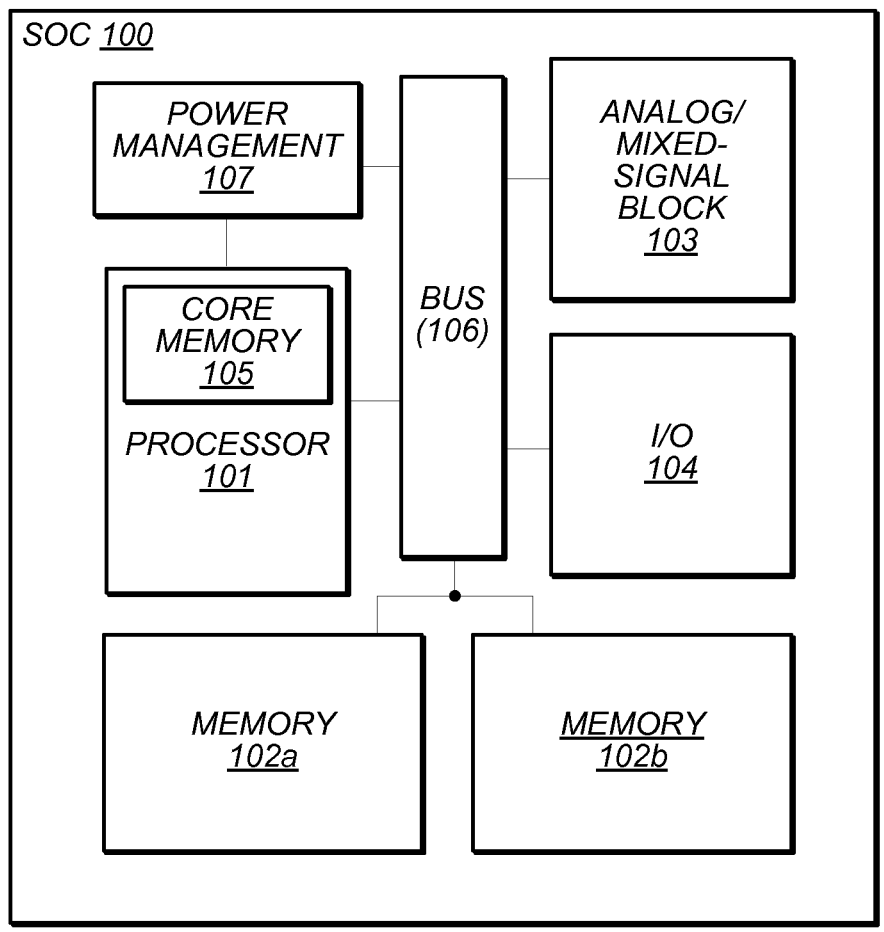
FIG. 1 illustrates an embodiment of a system-on-a-chip.

While the embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112(f) interpretation for that unit/circuit/component.

This specification includes references to "one embodiment" or "an embodiment." The appearances of the phrases "in one embodiment" or "in an embodiment" do not necessarily refer to the same embodiment, although embodiments that include any combination of the features are generally contemplated, unless expressly disclaimed herein. Particular features, structures, or characteristics may be combined in any suitable manner consistent with this disclosure.

DETAILED DESCRIPTION OF EMBODIMENTS

A system-on-a-chip (SoC) may include one or more functional blocks, such as, e.g., memories and power supplies, which may integrate the function of a computing system onto a single integrated circuit. Since an SoC may integrate multiple features into a single circuit, they are a popular choice for portable devices where space for components is limited.

To reduce power consumption in some SoC designs, multiple power supply voltages may be generated within the SoC to provide power to various functional blocks. In some embodiments, each power supply voltage may be employed for operating a functional block in a different operational mode. For example, one of the generated power supply voltages may be lower than a nominal supply voltage in order to conserve power or to prevent damage to the circuit. A suitable voltage may be higher than the nominal supply voltage to improve performance or for proper operation of the circuit. The suitable voltage for a given feature may change during operation as the features moves from one state to another, such as, for example, a random access memory (RAM) transitioning from a fully operational read and write state, which may require a voltage equal to the nominal supply voltage, to a lower power retention state in which the memory values are retained, but data cannot be read or written, which may require a voltage level lower than the nominal supply voltage level. Another example is a flash memory which may require a voltage level higher than the nominal supply voltage level to write data but may only require a voltage level equal to the nominal supply voltage to read data.

To generate a voltage level higher or lower than the nominal supply voltage level, an active power regulating circuit may require monitoring of the generated output voltage level and comparing the output voltage level to one or more known reference voltage levels. The output voltage level may be adjusted higher or lower based on this comparison. This process of monitoring and comparing the output voltage level may consume power and may therefore negate some of the desired power savings and temperature reduction. One approach to reducing the power consumption of the monitoring process may include using a clocked digital circuit to periodically enable a voltage reference and a comparison circuit which may then sample and compare the output voltage level to the reference voltage level. This approach may reduce power consumption by limiting the time the voltage reference and comparison circuit are active, but may introduce another source of power consumption to provide a clock signal with an adequate frequency for monitoring the output voltage level. A different approach may include increasing or decreasing a frequency of the clock signal based on an operational state of the power regulating circuit.

Various embodiments of a voltage monitoring system are described in this disclosure. The embodiments illustrated in the drawings and described below may provide techniques for sampling and comparing voltage signals used by peripheral circuits within a computing system.

The embodiments illustrated and described herein may employ CMOS circuits. In various other embodiments, however, a different suitable technology may be employed.

Some terms commonly used in reference to SoC designs and CMOS circuits are used in this disclosure. For the sake of clarity, it is noted that "high" or "high logic level" refers to a voltage sufficiently large to turn on a n-channel metal-oxide semiconductor field-effect transistor (MOSFET) and turn off a p-channel MOSFET while "low" or "low logic level" refers to a voltage that is sufficiently small enough to do the opposite. In other embodiments, different technology may result in different voltage levels for "low" and "high."

System Overview

A block diagram of an SoC is illustrated in FIG. 1. In the illustrated embodiment, the SoC 100 includes a processor 101 coupled to memory blocks 102a and 102b, an analog/mixed-signal block 103, an I/O block 104, and a power management unit 107, through a system bus 106. Processor 101 is also coupled directly to a core memory 105. In various embodiments, SoC 100 may be configured for use in various mobile computing applications such as, e.g., tablet computers, smartphones, or wearable devices.

Processor 101 may, in various embodiments, be representative of a general-purpose processor that performs computational operations. For example, processor 101 may be a central processing unit (CPU) such as a microprocessor, a microcontroller, an application-specific integrated circuit (ASIC), or a field-programmable gate array (FPGA). In some embodiments, processor 101 may include multiple CPU cores. In some embodiments, processor 101 may include one or more register files and memories.

In various embodiments, processor 101 may implement any suitable instruction set architecture (ISA), such as, e.g., PowerPC™, or x86 ISAs, or combination thereof. Processor 101 may include one or more bus transceiver units that allow processor 101 to communicate to other functional blocks within SoC 100 such as, memory blocks 102a and 102b, for example.

Memory 102a and memory 102b may include any suitable type of memory such as, for example, a Dynamic Random Access Memory (DRAM), a Static Random Access Memory (SRAM), a Read-only Memory (ROM), Electrically Erasable Programmable Read-only Memory (EEPROM), a FLASH memory, a Ferroelectric Random Access Memory (FeRAM), Resistive Random Access Memory (RRAM or ReRAM), or a Magnetoresistive Random Access Memory (MRAM), for example. Some embodiments may include single memory, such as memory 102a and other embodiments may include more than two memory blocks (not shown). Memory 102a and memory 102b may be multiple instantiations of the same type of memory or may be a mix of different types of memory. In some embodiments, memory 102a and memory 102b may be configured to store program instructions that may be executed by processor 101. Memory 102a and memory 102b may, in other embodiments, be configured to store data to be processed, such as graphics data for example.

Analog/mixed-signal block 103 may include a variety of circuits including, for example, an analog-to-digital converter (ADC) and a digital-to-analog converter (DAC) (neither shown). One or more clock sources may also be included in analog/mixed signal block 103, such as a crystal oscillator, a phase-locked loop (PLL) or delay-locked loop (DLL). In some embodiments, analog/mixed-signal block 103 may also include radio frequency (RF) circuits that may be configured for operation with cellular or other wireless networks. Analog/mixed-signal block 103 may include one or more voltage regulators to supply one or more voltages to various functional blocks and circuits within those blocks.

I/O block 104 may be configured to coordinate data transfer between SoC 100 and one or more peripheral devices. Such peripheral devices may include, without limitation, storage devices (e.g., magnetic or optical media-based storage devices including hard drives, tape drives, CD drives, DVD drives, etc.), audio processing subsystems, graphics processing subsystems, or any other suitable type of peripheral devices. In some embodiments, I/O block 104 may be configured to implement a version of Universal Serial Bus (USB) protocol, or IEEE 1394 (Firewire®) protocol, and may allow for program code and/or program instructions to be transferred from a peripheral storage device for execution by processor 101. In one embodiment, I/O block 104 may be configured to perform the data processing necessary to implement an Ethernet (IEEE 802.3) networking standard.

Core memory 105 may be configured to store frequently used instructions and data for the processor 101. Core memory 105 may be comprised of SRAM, DRAM, or any other suitable type of memory. In some embodiments, core memory 105 may be a part of a processor core complex (i.e., part of a cluster of processors) as part of processor 101 or it may be a separate functional block from processor 101. In some embodiments, core memory may include one or more cache memories.

System bus 106 may be configured as one or more buses to couple processor 101 to the other functional blocks within the SoC 100 such as, e.g., memory 102a, and I/O block 104. In some embodiments, system bus 106 may include interfaces coupled to one or more of the functional blocks that allow a particular functional block to communicate through the link. In some embodiments, system bus 106 may allow movement of data and transactions between functional blocks without intervention from processor 101. For example, data received through the I/O block 104 may be stored directly to memory 102a.

Power management unit 107 may be configured to manage power delivery to some or all of the functional blocks included in SoC 100. Power management unit 107 may include sub-blocks for managing multiple power supplies for various functional blocks. In various embodiments, the power supplies may be located in analog/mixed-signal block 103, in power management unit 107, in other blocks within SoC 100, or come from external to SoC 100, coupled through power supply pins. Power management unit 107 may receive signals that indicate the operational state of one or more functional blocks. In response to the operational state of a functional block, power management unit may adjust an output of a power supply. Power management unit 107 may also receive one or more clock signals for use in managing and adjusting an output of a power supply.

It is noted that the SoC illustrated in FIG. 1 is merely an example. In other embodiments, different functional blocks and different configurations of functions blocks may be possible dependent upon the specific application for which the SoC is intended. It is further noted that the various functional blocks illustrated in SoC 100 may operate at different clock frequencies, and may require different power supply voltage levels.

Figure 2:
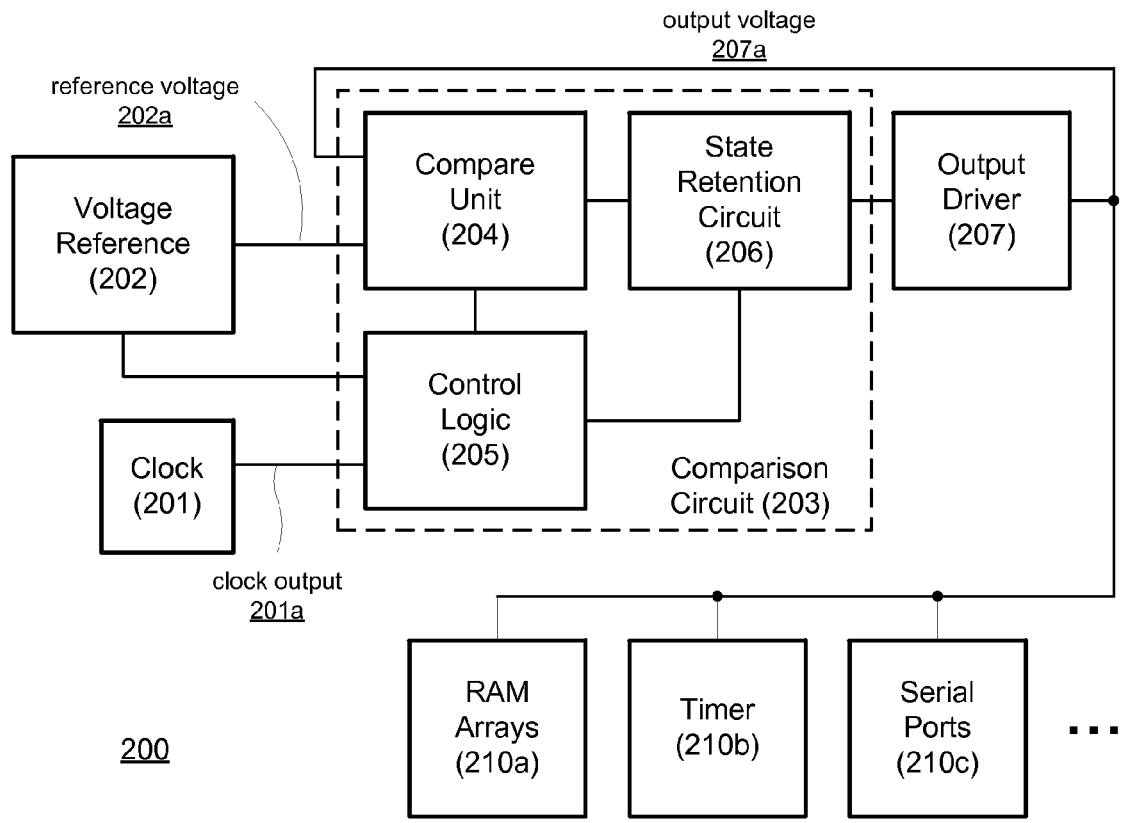
FIG. 2 illustrates a block diagram of an embodiment of a power supply system.

Turning to FIG. 2, a block diagram of an embodiment of a power supply unit is illustrated. Power supply unit 200 may correspond to a power supply or other power source in an SoC such as, for example, SoC 100. In the illustrated embodiment, power supply unit 200 may include comparison circuit 203 coupled to clock 201, voltage reference 202, and output driver 207. In some embodiments, one or more functional blocks (e.g., RAM arrays 210a, timer 210b, and serial port 210c) may receive a voltage supply output from output driver 207. Comparison circuit 203 may further include sub-blocks such as compare unit 204, control logic block 205, and state retention circuit 206.

In some embodiments, clock output 201a of clock 201 may be used by comparison circuit 203 to establish a sampling rate. Clock 201 may, in some embodiments, be in another part of SoC 100 and provide clock output 201a to the comparison circuit 203. In other embodiments, clock 201 may be included within power supply unit 200, and may be included within comparison circuit 203. Clock output 201a may run continuously while power supply unit 200 is operating. In other embodiments, clock 201 may enable and disable clock output 201a as needed by comparison circuit 203. In systems where clock 201 is in another part of SoC 100, the enabling and disabling of clock output 201a may be used to enable and disable comparison circuit 203.

Voltage reference 202 may, in various embodiments, be configured to produce one or more consistent voltage outputs that may be used as reference voltage 202a by other sub-blocks in comparison circuit 203, such as compare unit 204. Voltage reference 202 may be designed according to one of various design styles. For example a resistor ladder, a band-gap reference, or any other suitable circuit may be employed. In some embodiments, a resistor ladder may be connected between a power supply node and ground. A power supply refers to the main operating voltage for digital logic in the SoC. Ground refers to the common ground voltage for the digital logic. The resistor ladder may have one or more "tap" points wherein the voltage at a given tap is equal to the value of the resistance between the tap and ground divided by the value of the total resistance between the power supply and ground. In some embodiments, the voltage reference 202 may be further configured adjust the total value of the resistance ladder to compensate for fluctuations in the manufacturing process in order to maintain a consistent value from device to device.

To conserve power, voltage reference 202 may be disabled upon a de-assertion of an enable signal when not in use and enabled in response to an assertion of an enable signal. When voltage reference 202 is initially enabled, the output may require a brief amount of time to settle to a steady state in which reference voltage 202a is ready to be used as a reference. For example, if voltage reference 202 is of a resistor ladder type, then the output when voltage reference 202 is disabled may be equal to the power supply voltage. When voltage reference 202 is enabled in this case, the output will settle to a voltage level less than the power supply voltage. The transition from an output equal to the power supply voltage to the desired reference voltage level will take a finite amount of time. It should be noted, that power supply output levels typically have some amount of fluctuation due to a variety of reasons, such as, for example, switching noise in the system, the design of the power supply itself, and/or ambient electro-magnetic noise in the environment. Therefore, in the following descriptions, when the terms stable or stabilized are used in reference to a voltage, it refers the voltage being in a state steady enough to be used by the system.

Comparison circuit 203 may compare two or more voltage levels and produce a digital value dependent upon the comparison. For example, if voltage levels of two input signals, A and B, are compared, comparison circuit 203 may produce a logic "1" if the level of A is greater than the level of B and a logic "0" if the level of B is greater than the level of A. In various embodiments, comparison circuit may produce a logic "0" or a logic "1" if the voltage levels of signals A and B are equal.

To perform comparisons, comparison circuit 203 may include sub-blocks compare unit 204, control logic 205 and state retention circuit 206. Compare unit 204 may, in various embodiments, receive two analog input signals and generate a digital signal whose value is dependent upon the relationship between the two input signals. In the embodiment illustrated in FIG. 2, compare unit 204 receives reference voltage 202a from voltage reference 202 and the output of output driver 207, output voltage 207a. Compare unit 204 may output a logic 1 when output voltage 207a is greater than reference voltage 202a and output a logic 0 otherwise.

Any one of various design styles may be used to implement compare unit 204. For example, compare unit 204 may employ a sense amplifier, an analog comparator, or any other suitable circuit for comparing the voltage levels of two or more signals. Compare unit 204 may initiate a comparison upon receiving an enable signal from control logic 205.

Control logic 205 may be configured to, in some embodiments, control and enable other circuits of power supply system 200 such as, for example, voltage reference 202 and compare unit 204. In some embodiments, control logic 205 may receive clock output 201a and use this clock signal to coordinate these other circuits. Control circuit 205 may, in some embodiments, enable voltage reference 202 first and then delay to allow voltage reference 202 to stabilize before enabling compare unit 204 and other sub-blocks. More details of control logic 205 will be presented below.

State retention circuit 206 may, in various embodiments, be configured to receive one or more output signals from compare unit 204 and may save the values of the output signals after compare unit 204 stops driving them. In some embodiments, state retention circuit 206 may output a digital value corresponding to a current state of comparison unit 204 as well as one or more previously saved states. In some embodiments, the digital value may be a digital word including multiple data bits. The digital word may, in various embodiments, be encoded according to one of a variety of encoding schemes, such as, e.g., binary coded decimal (BCD), for example.

Output driver 207 may drive output voltage 207a, which may then be used by other functional blocks as a power supply. A voltage level of output voltage 207a may be controlled by the digital value output by state retention circuit 206. As the digital value received from state retention circuit 206 changes, the voltage level of the output signal may change accordingly.

In the example embodiment, RAM arrays 210a, timer 210b, and serial ports 210c are the recipients of output voltage 207a. These peripherals 210a-210c may enter a low power or background state before receiving output voltage 207a. It is noted that RAM arrays 210a, timer 210b, and serial ports 210c are used merely as example functional blocks. Any suitable functional block within SoC 100 may utilize output voltage 207a as a power supply in a reduced power mode.

It is noted that the system illustrated in FIG. 2 is merely an example. In other embodiments, different functional blocks and different configurations of functions blocks are possible dependent upon the specific application for which the system is intended.

Figure 3:
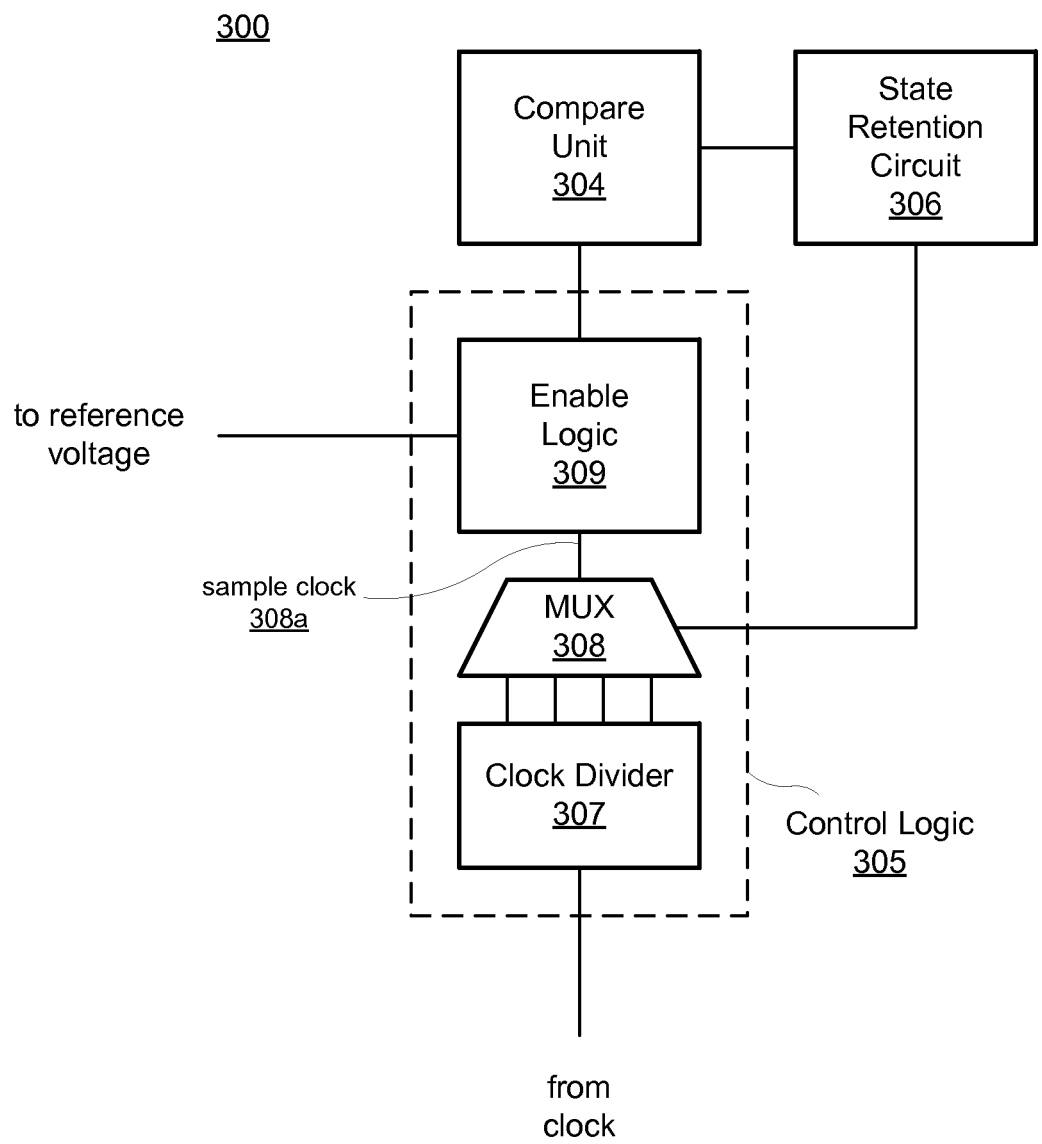
FIG. 3 illustrates one embodiment of a block diagram of a comparison circuit.

Moving to FIG. 3, comparison circuit 300 is illustrated. Comparison circuit 300 may correspond, in some embodiments, to comparison circuit 203 in FIG. 2. Comparison circuit 300 consists of control logic 305 coupled to compare unit 304 and state retention circuit 306. In some embodiments, compare unit 304 and state retention circuit 306 may correspond to compare unit 204 and state retention circuit 206 in FIG. 2 and may, therefore, function as described in regards to FIG. 2.

Control logic 305 may correspond to control logic 205 in FIG. 2. Control logic 305 may, similar control logic 205, be configured to control and enable other circuits of a power supply systems such as illustrated in FIG. 2 and may also receive a clock signal such as provided by clock 201. Control logic 305 may include clock divider 307 coupled to multiplexing unit (MUX) 308 which may be further coupled to state retention circuit 306 as well as enable logic 309.

Clock divider 307 may receive the clock signal from clock 201 and may output multiple divided clock signals, each with frequencies of various ratios from the frequency of clock 201. In some embodiments, clock divider 307 may utilize several flip-flop circuits arranged in series to produce clock signals with frequencies divided by powers of two from the received clock frequency. For example, clock divider 307 may produce clock signals with frequencies that are equal to the received frequency divided by 1, 2, 4, 8 and so on. Alternatively, clock divider 307 may produce frequencies divided by positive integer values such as 1, 2, 3, 4, etc. Clock divider 307 may be implemented as any suitable clock signal divider circuit.

MUX 308 may receive one or more clock signals from clock divider 307 and may also receive the clock signal from clock 201. MUX 308 may be used to select one of two or more clock signals of different frequencies. Generally speaking, a multiplexing circuit, such as MUX 308, may be used to receive a number of input signals and select one signal as an output signal. Selection of the one output signal may be determined by one or more selection signals. The number of input signals may be limited by the number of selection signals, such that for n selection signals, up to $2^n$ signals may be input.

An output from state retention circuit 306 may be received by MUX 308 and used to select one of the clock signal inputs to be used as sample clock 308a. The output from state retention circuit 306 may include a digital value of one or more bits, the bits may include a current state of comparison unit 304 as well as one or more previously saved states. In some embodiments, this digital value may be used as the selection signals of MUX 308 and may, therefore, select a clock signal of a different frequency as sample clock 308a upon a change in value of a current comparison or a previous comparison. In other embodiments, additional logic may be used to decode the output from state retention circuit 306 and apply appropriate selection signals to MUX 308 accordingly.

Sample clock 308a may be received by enable logic 309. Enable logic 309 may include circuitry for asserting and de-asserting enable signals for a reference voltage (such as voltage reference 202 in FIG. 2) and compare unit 304. Enable logic 309 may assert the enable signals in response to an active edge of sample clock 308a. In various embodiments, the active edge of sample clock 308a may be a rising edge, a falling edge or both edges, depending on the design of the circuits. Enable logic 309 may assert the enable signal to compare unit 304 after a pre-determined delay from asserting the enable signal to voltage reference 202, thus providing time for voltage reference 202 to stabilize as previously described in regards to FIG. 2.

Since sample clock 308a may be selected dependent upon the current and previous values output by compare unit 304, the frequency with which comparisons are made, also referred to as the sample rate, may be dependent upon these current and previous values. Thus, a system may be established in which the sample rate is dynamically adjusted in response to changes in the sampled values.

It is contemplated that, in alternative embodiments, clock divider 307 and MUX 308 may be replaced by an adjustable frequency clock source, such as, for example, a voltage controlled oscillator (VCO) or digitally controlled oscillator (DCO). Feedback from state retention circuit 306 may, in such embodiments, be used to set a frequency of the VCO or DCO rather than selecting from multiple clock signals using MUX 308.

FIG. 3 is merely one example of a comparison circuit used to demonstrate the disclosed concepts. In other embodiments, more functional blocks may be included and the function and arrangement of the functional blocks may differ per requirements for the particular embodiment.

Figure 4:
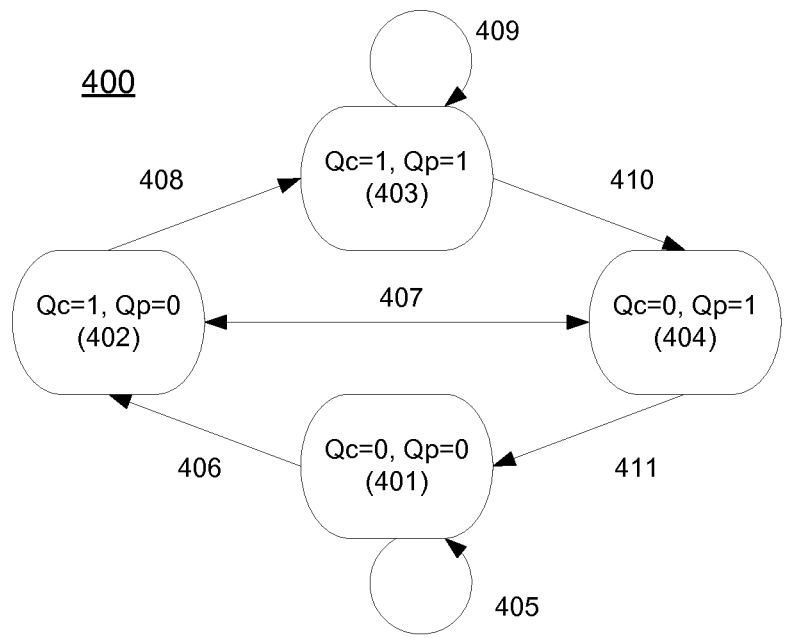
FIG. 4, which includes FIG. 4(A), a state diagram of an embodiment of a power supply system, and FIG. 4(B), a table of sampling frequencies corresponding to the states.

Turning now to FIG. 4, illustration 4(A) and table 4(B) are presented. State diagram 400 is illustrated in FIG. 4(A), and may apply to an embodiment of a comparison circuit such as comparison circuit 300 in FIG. 3. A table of sampling frequencies corresponding to the states in state diagram 400 is shown in table 4(B). In this example embodiment, operation of the comparison circuit is simplified to four states, 401-404, as determined by the current state, Qc and the previous state, Qp. Referring collectively to SoC 100 of FIG. 1, power supply unit 200 of FIG. 2 and comparison circuit 300 of FIG. 3, comparison circuit 300 may initially be in state 401 upon a power-on or reset of SoC 100.

In state 401, Output voltage 207a is below reference voltage 202a and was also below reference voltage 202a during the previous comparison, i.e., Qc=0 and Qp=0. Since output voltage 207a has been below reference voltage 202a for at least two comparison cycles in a row, sample clock 308a may be set to its fastest rate which may be clock output 201a divided by 1. There may be two transitions out of state 401, transitions 405 and 406. If output voltage 207a remains below reference voltage 202a during the next comparison, then transition 405 may occur, in which case, comparison circuit 300 may remain in state 401 and sample clock 308a may remain equal to clock output 201a. If output voltage 207a is greater than reference voltage 202a during the next comparison, then transition 406 may occur and comparison circuit 300 may transition into state 402.

In state 402, output voltage 207a has increased from being less than reference voltage 202a in the previous comparison (Qp=0) to being greater than reference voltage 202a in the current comparison (Qc=1). In state 402, sample clock 308a may be set to clock output 201a divided by 4. In this state, it is known that output voltage 207a is being raised since Qc has transitioned from 0 to 1. It is also known that since this transition has just occurred, output voltage 207a may still be close to reference voltage 202a. Sample rate 308a may, therefore, be set to a lower rate knowing output voltage 207a is rising, but not the lowest rate so a detection may be made sooner if output voltage 207a does fall back below reference voltage 202a. Two transitions may be available to leave state 402, transitions 407 and 408. Transition 407 may be taken if output voltage 207a falls back below reference voltage 202a at the next comparison, transitioning comparison circuit 300 to state 404. Otherwise, if output voltage 207a remains greater than reference voltage 202a, transition 408 may transition comparison circuit 300 to state 403.

In state 403, output voltage 207a is greater than reference voltage 202a (Qc=1) and was also greater than reference voltage 202a in the previous comparison (Qp=1). In state 403, sample clock 308a may be set to clock output 201a divided by 8. In this state, output voltage 207a has been greater than reference voltage 202a for at least two comparison cycles. Output voltage 207a may fall more slowly than it is raised, and therefore, sample clock 308a may be set to the slowest rate to reduce power consumption as much as possible, knowing that changes in output voltage 207a may occur more slowly relative to the other states. Two transitions may be available from state 403, transitions 409 and 410. Transition 409 may be taken if output voltage 207a remains greater than reference voltage 202a, which keeps comparison circuit 300 in state 403. If output voltage 207a falls below reference voltage 202a, then transition 410 may be taken and comparison circuit 300 may move to state 404.

In state 404, output voltage 207a has fallen from being higher than reference voltage 202a in the previous comparison (Qp=1) to lower than reference voltage 202a in the current comparison (Qc=0). In state 404, sample clock 308a may be set to clock output 201a divided by 2. In this state, it is now known that output voltage 207a is falling since Qc has transitioned from 1 to 0. Knowing that output voltage 207a has just crossed below reference voltage 202a, sample clock 308a may be set at a higher rate to monitor output voltage 207a which will now start to rise back above reference voltage 202a. Two transitions may be available from state 404, transitions 407 and 411. Transition 407 may be taken if output voltage 207a increases to greater than reference voltage 202a in the next comparison, moving comparison circuit 300 into state 402. Otherwise, if output voltage 207a remains below reference voltage 202a, transition 411 may take comparison circuit 300 back to state 401.

It is noted that FIG. 4 is merely an example of a state diagram for a power supply system such as comparison circuit 203. The number of states and the transitions between states may differ in other embodiments based on the application for which the comparison circuit is intended. The sample rates listed in table 4(B) are merely examples for demonstration. In other embodiments, other sample rates may be used and more table rows may be included in embodiments with more states. It is contemplated that two or more rows of table 4(B) may share a same value for the sample rate.

Signal Comparison Methods

Figure 5:
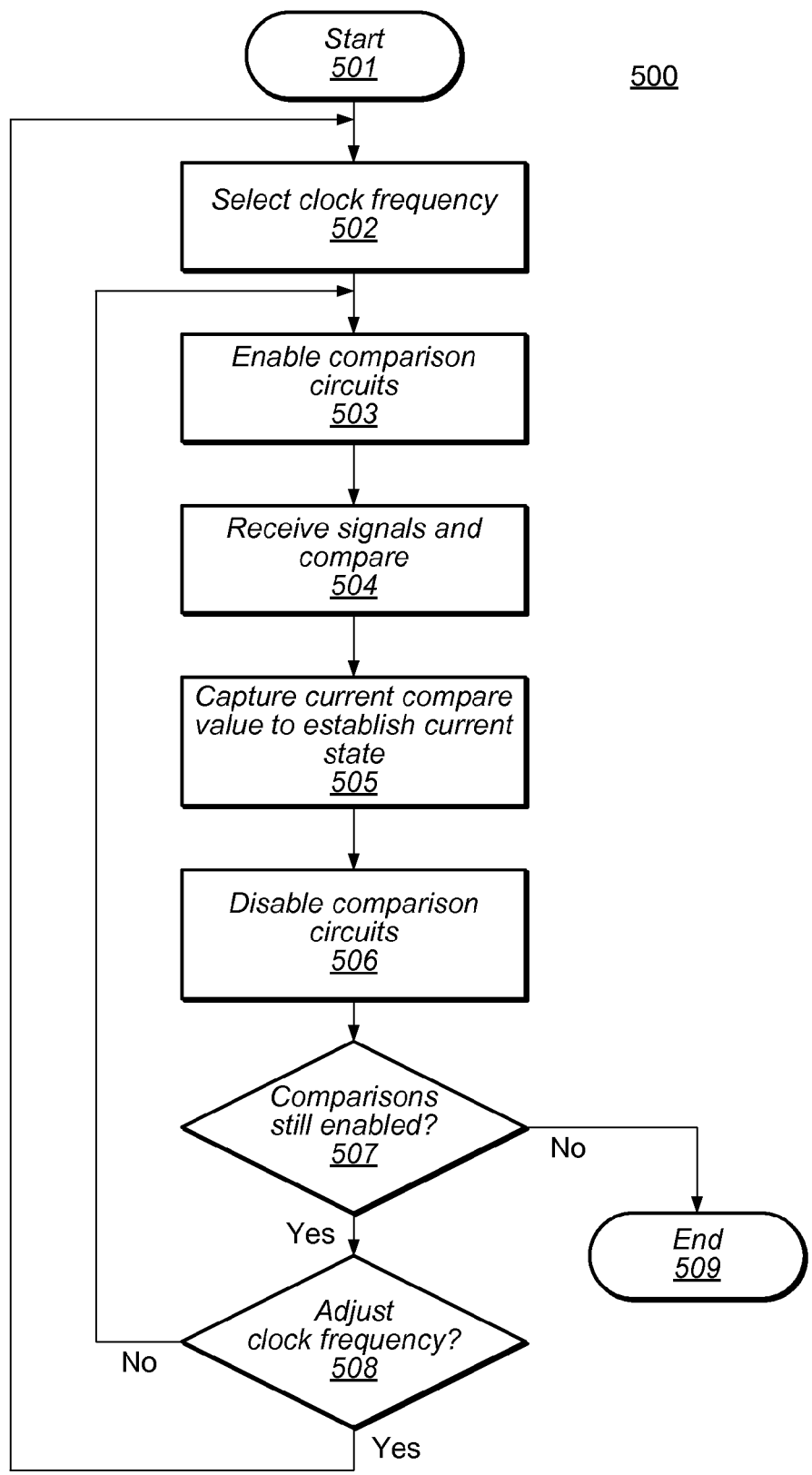
FIG. 5 illustrates a flowchart of an embodiment of a method for operating a comparison circuit.

Moving now to FIG. 5, a flowchart is illustrated depicting an embodiment of method 500 for managing the operation of a comparison circuit, such as, e.g., comparison circuit 300 as illustrated in FIG. 3. Referring collectively to comparison circuit 300, SoC 100 in FIG. 1, power supply unit 200 in FIG. 2, state diagram 400 in FIG. 4 and the flowchart in FIG. 5, method 500 may begin in block 501 with power supply unit 200 being enabled.

Comparison circuit 300 may select a frequency to use for sample clock 308a (block 502). If power supply unit 200 is being enabled for the first time since SoC 100 has been powered on or since a reset has occurred, then state retention circuit 306 may provide default values of a current comparison, Qc, and a previous comparison, Qp. In some embodiments, the default values may be Qc=0 and Qp=0, while other values may be used in other embodiments. If power supply unit 200 has been enabled since the last SoC reset, then the most recent values for Qc and Qp may be used to determine the frequency for sample clock 308a.

After sample clock 308a has been selected, then circuits necessary for performing a comparison may be enabled by enable logic 309 at the next active edge of sample clock 308a (block 503). As previously disclosed, the active edge of sample clock 308a may be a rising edge, falling edge or both edges. The necessary circuits may include voltage reference 202 and compare unit 304. In some embodiments, voltage reference 202 may require a pre-determined amount of time to settle after being enabled. In some embodiments, compare unit 304 may need to be enabled before performing a comparison, while in other embodiments, compare unit 304 may be ready to make a comparison as soon as signals to be compared have settled. Enable logic 309 may include one or more delay circuits to provide adequate time for the enabled circuits to settle.

Compare unit 304 may receive two or more signals to compare (block 504). In some embodiment, compare unit 304 may receive two signals to compare, such as, for example, reference voltage 202a and output voltage 207a as shown in FIG. 2. In other embodiments, compare unit 304 may receive more than two signals for comparison. For example, voltage reference 202 may provide two outputs, reference voltage 202a and reference voltage 202b (not shown) which may have a higher voltage level than reference voltage 202a. In such an embodiment, output voltage 207a may be compared to both reference voltages 202a and 202b.

Compare unit 304 may perform a comparison of the received signals. After appropriate delays to allow input signals to settle, compare unit 304 may receive a signal from enable logic 309 to perform a comparison. In the case of two signals to compare, compare unit 304 may output a logic 1 if output voltage 207a is greater than reference voltage 202a and output a logic 0 otherwise. In the example in which voltage reference 202 outputs reference voltages 202a and 202b for the comparison, then compare unit may output a two-bit value for each comparison. Such two-bit values may correspond to "00" if output voltage 207a is less than reference voltage 202a, "01" if output voltage 207a is between reference voltage 202a and reference voltage 202b, and "11" if output voltage 207a is higher than reference voltage 202b. The output values from compare unit 304 are used as examples. Other combinations of values are known and contemplated.

The comparison output values from compare unit 304 may be provided to state retention circuit 306 for temporary storage (block 505). The present comparison value received from compare unit 304 may be combined with or compared to one or more previous comparison values to generate a present state of power supply unit 200. The number of previous comparison values used to generate the present state may determine how long each received comparison value is stored. For example, if one previous comparison value is used in conjunction with the present comparison value to determine the present state, then the previous comparison value may be discarded when a new present comparison value is received and the old present comparison value may become the previous comparison value. Depending on a number of bits received from compare unit 304 for each comparison and on the number of previous comparison values used to determine a state, a total number of possible operating states may range from a few to many. The determined current state may be used by power supply unit 200 to adjust output voltage 207a.

Circuits associated with the comparison circuit 300 may be disabled (block 506). Compare unit 304 and/or voltage reference 202 may be disabled or placed into reduced power modes to conserve power until the next comparison is initiated. Some circuits within comparison circuit 300 may remain enabled in preparation for a next comparison.

Method 500 may depend upon a determination if more comparisons will be made (block 506). If power supply unit 200 remains enabled, then more comparisons may be required and the method may move to block 507 to determine if the sample clock needs to be adjusted. Otherwise, if power supply unit 200 has been disabled, then comparisons may no longer be necessary and the method may end in block 509.

Method 500 may depend next on a determination if sample clock 308a should be adjusted (block 508). Control logic 305 may receive the present state from state retention circuit 306. Based on the present state of power supply unit 200, sample clock 308a may be adjusted to a new frequency or left at its current frequency. The decision to adjust sample clock 308a may be based on state diagram 400 and table 4(B) in FIG. 4. In other embodiments, other state diagrams may be used with a different number of states and a different table of sample rates may be used. If the determination is to adjust sample clock 308a, then the method may return to block 502 to select the new frequency for sample clock 308a. Otherwise, the method may return to block 503 to await the next active edge of sample clock 308a.

It is noted that the method illustrated in FIG. 5 depicts operations being performed in a sequential fashion. In various other embodiments, other operations may be performed in parallel or in a different sequence. Block 505 and block 506, for example, may be performed in parallel or in opposite order in other embodiments.

Figure 6:
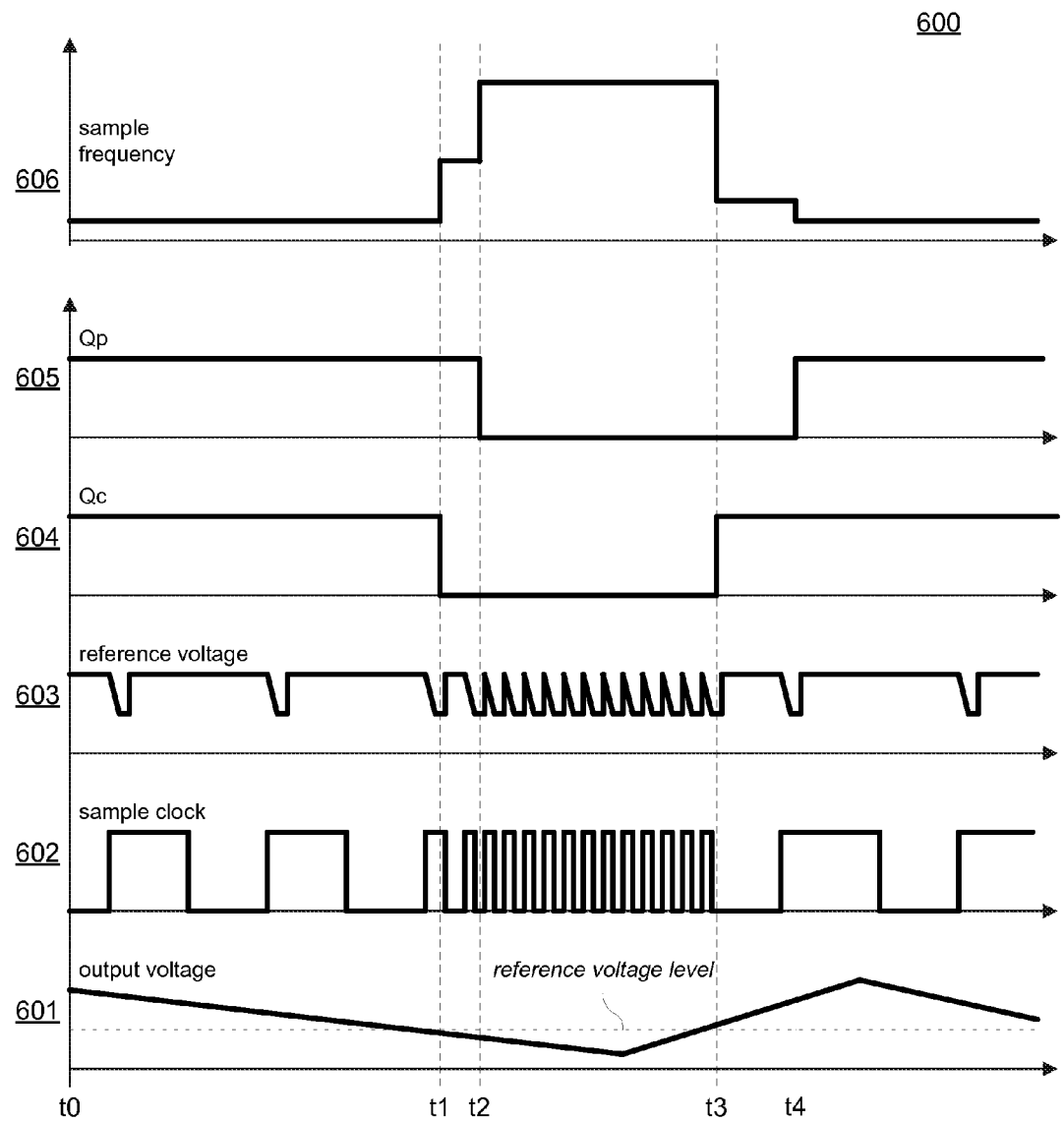
FIG. 6 illustrates example waveforms associated with the operation of an embodiment of a power supply system.

Turning to FIG. 6, chart 600 of possible waveforms associated with an embodiment of a power supply unit is illustrated. Referring collectively to power supply unit 200 in FIG. 2, comparison circuit 300 in FIG. 3, state diagram 400 of FIG. 4, and the chart in FIG. 6, the waveforms of FIG. 6 may correspond to an example operation of power supply unit 200. Waveform 601, on the bottom of the chart, indicates a voltage level of output voltage 207a versus time. A dashed line is included to indicate a voltage level corresponding to the reference voltage when voltage reference 202 is enabled. Waveform 602 shows a clock signal such as may be provided by sample clock 308a. Waveform 603 corresponds to a possible output of voltage reference 202, i.e., reference voltage 202a. Waveform 604 is an example of a present comparison value, Qc, as may be output by state retention circuit 306. Waveform 907 is an example of a previous comparison value, Qp, as may also be output by state retention circuit 306. Waveform 606 corresponds to a frequency of sample clock 308a versus time.

It is noted that waveform 603 shows the voltage level of reference voltage 202 a remaining high for a majority of the time and then falling to a lower level responsive to rising edges of sample clock 308a. As disclosed, previously, reference voltage 202a may rise to a voltage level corresponding to a voltage level of a power supply to voltage reference 202 when disabled and then fall to the predetermined reference voltage level when enabled. It is also noted that a finite amount of time is shown for reference voltage 202a to settle at the predetermined reference voltage level. Enable logic 309 may account for this settling time and may therefore trigger compare unit 304 after a predetermined delay from the rising edge of sample clock 308a.

At time t0, output voltage 207a, as shown in waveform 601, may be above reference voltage 202a, as shown by the dashed line. The most recent values of Qc and Qp (waveforms 604 and 605, respectively) may both be logic 1, indicating the output voltage 207a has been above reference voltage 202a for at least the last two comparisons. Power supply unit 200 may be operating in state 403 of state diagram 400. Sample clock 308a (waveform 602) may, therefore, be running at a lower frequency per table 4(B). The corresponding sample frequency, as shown in waveform 606, may be at its lowest value on chart 600.

A few comparisons may be made responsive to rising edges on sample clock 308a while output voltage 207a is higher than reference voltage 202a between time t0 and time t1. At time t1, however, a first comparison may be made by comparison circuit 300 after output voltage 207a has fallen below reference voltage 202a. As a result of this comparison, Qc may transition to a logic 0. Power supply unit 200 may enter a new state, for example, state 404 in state diagram 400, based on the new value of Qc. Responsive to changing state, sample clock 308a may switch to a higher frequency, per table 4(B), as shown in waveforms 602 and 606.

At time t2, a second comparison may be made with output voltage 207a lower than reference voltage 202a. Responsive to this latest comparison, Qc may remain at a logic 0 and Qp may transition to the previous value of Qc, i.e., also logic 0. Due to the change in value of Qp, power supply unit 200 may change states again, e.g., state 401 in state diagram 400, and the frequency of sample clock 308a may be increased again (waveforms 602 and 606) as determined in table 4(B).

Comparison circuit 300 may make multiple comparisons of output voltage 207a and reference voltage 202a while running at the higher frequency between time t2 and time t3, while output voltage 207a is lower than reference voltage 202a. At time t3, a first comparison may be made in which output voltage 207a has risen back above reference voltage 202a. In response, Qc may transition back to a logic 1 and power supply unit 200 may change states to state 402 in state diagram 400. The frequency of sample clock 308a may be reduced per table 4(B).

At time t4, a second comparison with output voltage 207a, again higher than reference voltage 202a, may result in Qc remaining a logic 1 and Qp receiving the previous value of Qc, also a logic 1. These values may result in power supply unit 200 changing back to state 401 and the frequency of sample clock 308a being lowered again, per table 4(B).

FIG. 6 is merely an example of waveforms that may result from the example embodiments as presented in this disclosure. The waveforms are simplified to provide clear descriptions of the disclosed concepts. In other embodiments, the waveforms may appear different due various influences such as technology choices for building the circuits, actual circuit design and layout, ambient noise in the environment, choice of power supplies, etc.

Numerous variations and modifications will become apparent to those skilled in the art once the above disclosure is fully appreciated. It is intended that the following claims be interpreted to embrace all such variations and modifications.

What is claimed is:

1. An apparatus, comprising:
a clock source configured to generate a clock signal;
a comparison circuit coupled to the clock source, wherein the comparison circuit is configured to:
select a first frequency of the clock signal;
receive a plurality of voltage signal inputs for comparison;
compare a voltage level of a first voltage signal input of the plurality of voltage signal inputs to a voltage level of a second voltage signal input of the plurality of voltage signal inputs in response to an active edge of the clock signal;
determine a comparison value corresponding to the comparison of the voltage levels; and
select a second frequency of the clock signal dependent upon the comparison value, wherein the second frequency is different than the first frequency;
wherein the plurality of voltage signal inputs include a first reference voltage signal and an output signal of a voltage regulator, and wherein the comparison circuit is further configured to:
enable the first reference voltage signal in response to the active edge of the clock signal; and
compare the first reference voltage signal to the output signal of the voltage regulator in response to a determination that a predetermined amount of time has elapsed since the first reference voltage signal was enabled.

2. The apparatus of claim 1 wherein the clock source comprises a multiplex circuit, wherein the clock signal corresponds to an output of the multiplex circuit, and wherein to select the second frequency, the comparison circuit is further configured to select a different input to the multiplex circuit as the clock signal.

3. The apparatus of claim 1 wherein the comparison circuit is further configured to disable the first reference voltage signal in response to the determination of the comparison value corresponding to the comparison of the voltage levels.

4. The apparatus of claim 1 wherein the plurality of voltage signal inputs includes a second reference voltage signal, wherein a voltage level of the second reference voltage signal is lower than a voltage level of the first reference voltage signal.

5. The apparatus of claim 4 wherein the comparison circuit is further configured to determine the comparison value dependent upon a determination that a voltage level of the output signal of the voltage regulator is greater than or equal to the voltage level of the first reference voltage signal, is between the voltage level of the first reference voltage signal and the voltage level of the second reference voltage signal, or is less than or equal to the voltage level of the second reference voltage signal.

6. The apparatus of claim 1, wherein the comparison circuit is further configured to:
store the comparison value, and
select the second frequency of the clock signal dependent upon a most recent comparison value and one or more previously stored comparison values.

7. The apparatus of claim 1, wherein the comparison circuit is further configured to select the second frequency of the clock signal to be higher than the first frequency of the clock signal in response to a determination that a voltage level of the first reference voltage signal is higher than a voltage level of the output signal of the voltage regulator.

8. A method, comprising:
selecting a first frequency of a clock signal;

receiving a plurality of signals for comparison, wherein the plurality of signals include a first reference voltage signal and an output signal of a voltage regulator;

enabling the first reference voltage signal in response to the active edge of the clock signal;

comparing a voltage level of a first signal of the plurality of signals to a voltage level of a second signal of the plurality of signals in response to an active edge of the clock signal, wherein comparing the voltage level of the first signal to a voltage level of the second signal comprises comparing the first reference voltage signal to the output signal of the voltage regulator in response to determining that a predetermined amount of time has elapsed since the active edge of the clock signal;

determining a comparison value dependent upon the comparison of the voltage levels; and selecting a second frequency of the clock signal dependent upon the comparison value wherein the second frequency is different than the first frequency.

9. The method of claim 8 wherein selecting a second frequency of the clock signal dependent upon the comparison value comprises adjusting a multiplex circuit to output the clock signal at the second frequency.

10. The method of claim 8 further comprising disabling the first reference voltage signal in response to determining the comparison value dependent upon the comparison of the voltage levels.

11. The method of claim 8 wherein the plurality of signals includes a second reference voltage signal, wherein a voltage level of the second reference voltage signal is lower than a voltage level of the first reference voltage signal.

12. The method of claim 11 further comprising determining the comparison value dependent upon a determination that a voltage level of the output signal of the voltage regulator is greater than or equal to the voltage level of the first reference voltage signal, is between the voltage level of the first reference voltage signal and the voltage level of the second reference voltage signal, or is less than or equal to the voltage level of the second reference voltage signal.

13. The method of claim 8, further comprising:
storing the comparison value, and
selecting the second frequency of the clock signal dependent upon a most recent comparison value and one or more previously stored comparison values.

14. The method of claim 8, further comprising selecting the second frequency of the clock signal to be higher than the first frequency of the clock signal in response to determining that a voltage level of the first reference voltage signal is higher than a voltage level of the output signal of the voltage regulator.

15. A system, comprising:
a reference voltage circuit configured to generate at least a first reference voltage signal;
a voltage generation circuit configured to generate an output voltage signal;
a voltage comparator module, coupled to the reference voltage circuit and the voltage generation circuit, wherein the voltage comparator module is configured to:
select a first frequency of a clock signal;
enable the first reference voltage signal in response to the active edge of the clock signal;
receive the first reference voltage signal and the output voltage signal for comparison;
compare a voltage level of the first reference voltage signal to a voltage level of the output voltage signal in response to an active edge of the clock signal;
determine a comparison value dependent upon the comparison of the voltage levels; and
select a second frequency of the clock signal dependent upon the comparison value;
wherein to compare the first reference voltage signal to the output voltage signal, the voltage comparator module is further configured to compare the first reference voltage signal to the output voltage signal in response to a determination that a predetermined amount of time has elapsed since the first reference voltage signal was enabled.

16. The system of claim 15 wherein the voltage comparator module includes a multiplex circuit and wherein to select the second frequency of the clock signal dependent upon the comparison value, the voltage comparator module is further configured to adjust the multiplex circuit to output the clock signal at the second frequency.

17. The system of claim 15 wherein the reference voltage circuit is further configured to provide a second reference voltage signal, wherein a voltage level of the second reference voltage signal is lower than the voltage level of the first reference voltage signal.

18. The system of claim 17 wherein the voltage comparator module is further configured to determine the comparison value dependent upon a determination that the voltage level of the output voltage signal is greater than or equal to the voltage level of the first reference voltage signal, is between the voltage level of the first reference voltage signal and the voltage level of the second reference voltage signal, or is less than or equal to the voltage level of the second reference voltage signal.

19. The system of claim 15, wherein the voltage comparator module is further configured to:
store the comparison value, and
select the second frequency of the clock signal dependent upon a most recent comparison value and one or more previously stored comparison values.

20. The system of claim 15, wherein the voltage comparator module is further configured to disable the first reference voltage signal in response to the determination of the comparison value corresponding to the comparison of the voltage levels.

* * * * *